(12) United States Patent
Adachi

(10) Patent No.: US 9,854,681 B2
(45) Date of Patent: Dec. 26, 2017

(54) COMPONENT-EMBEDDED SUBSTRATE

(71) Applicant: Murata Manufacturing Co., Ltd., Kyoto (JP)

(72) Inventor: Toshiro Adachi, Kyoto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 379 days.

(21) Appl. No.: 14/327,806

(22) Filed: Jul. 10, 2014

(65) Prior Publication Data

US 2014/0321086 A1   Oct. 30, 2014

Related U.S. Application Data

(63) Continuation of application No. PCT/JP2013/052885, filed on Feb. 7, 2013.

(30) Foreign Application Priority Data

Feb. 17, 2012   (JP) .................................. 2012-033068

(51) Int. Cl.
*H05K 1/11* (2006.01)
*H05K 1/18* (2006.01)
(Continued)

(52) U.S. Cl.
CPC ........... *H05K 1/188* (2013.01); *H05K 3/4697* (2013.01); *H01L 2224/16225* (2013.01);
(Continued)

(58) Field of Classification Search
CPC ........ H05K 1/111; H05K 1/186; H05K 1/188; H05K 2201/10522; H05K 3/4069; H05K 3/4617; H05K 3/4697
(Continued)

(56) References Cited

U.S. PATENT DOCUMENTS 6,038,133 A * 3/2000 Nakatani ............. G06F 17/3089
174/255
6,724,638 B1   4/2004 Inagaki
(Continued)

FOREIGN PATENT DOCUMENTS

CN   1293790 C   3/2007
JP   2002-118367 A   4/2002
(Continued)

OTHER PUBLICATIONS

International Search Report issued in Application No. PCT/JP2013/052885 dated Mar. 12, 2013.
(Continued)

*Primary Examiner* — Jenny L Wagner
*Assistant Examiner* — Michael P McFadden
(74) *Attorney, Agent, or Firm* — Pearne & Gordon LLP

(57) ABSTRACT

A component-embedded substrate includes: a resin substrate having a mount surface and a peripheral surface surrounding a perimeter of the mount surface; a first mounted component mounted on the mount surface; a second mounted component mounted on the mount surface and spaced from the first mounted component; and a first embedded chip-type electronic component disposed in the resin substrate. The first embedded chip-type electronic component is located close to the peripheral surface of the resin substrate. The mount surface includes: a first region located between the first and second mounted components and extending along a cross direction crossing an arrangement direction along which the first and second mounted components are arranged with respect to each other; and a second region located outside the first region. The first embedded chip-type electronic component is arranged to extend in the first and second regions as seen from above the mount surface.

14 Claims, 18 Drawing Sheets

(51) Int. Cl.
*H05K 3/40* (2006.01)
*H05K 3/46* (2006.01)

(52) U.S. Cl.
CPC .............. *H05K 1/111* (2013.01); *H05K 1/186* (2013.01); *H05K 3/4069* (2013.01); *H05K 3/4617* (2013.01); *H05K 2201/10522* (2013.01)

(58) Field of Classification Search
USPC ........................................................ 361/763
See application file for complete search history.

(56) References Cited

U.S. PATENT DOCUMENTS

| | | | |
|---|---|---|---|
| 6,975,516 | B2 | 12/2005 | Asahi et al. |
| 7,294,587 | B2 | 11/2007 | Asahi et al. |
| 2003/0090883 | A1 | 5/2003 | Asahi et al. |
| 2005/0269681 | A1 | 12/2005 | Asahi et al. |
| 2008/0094793 | A1* | 4/2008 | Sakurai ................ G11O 5/04 361/679.01 |
| 2009/0107703 | A1 | 4/2009 | Abe |
| 2009/0316373 | A1* | 12/2009 | Kim .................... H01L 23/5389 361/764 |
| 2011/0228464 | A1* | 9/2011 | Guzek ............... H01L 23/49816 361/679.31 |
| 2012/0153493 | A1* | 6/2012 | Lee ........................ H01L 25/16 257/774 |
| 2012/0281379 | A1* | 11/2012 | Shimada ............... H01L 21/486 361/782 |

FOREIGN PATENT DOCUMENTS

| | | |
|---|---|---|
| JP | 2005-197354 A | 7/2005 |
| JP | 2005-197389 A | 7/2005 |
| JP | 2005-223226 A | 8/2005 |
| JP | 2008-294475 A | 12/2008 |
| JP | 2008-311243 A | 12/2008 |
| WO | 2007/119608 A1 | 10/2007 |

OTHER PUBLICATIONS

Written Opinion issued in Application No. PCT/JP2013/052885 dated Mar. 12, 2013.

* cited by examiner

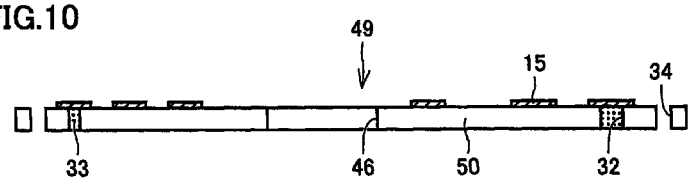
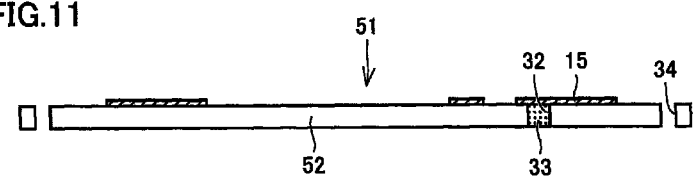
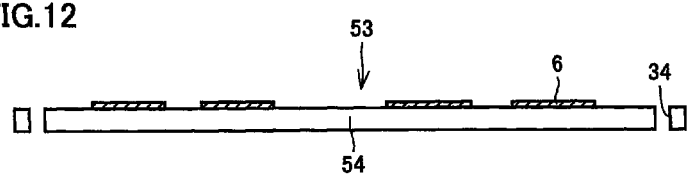
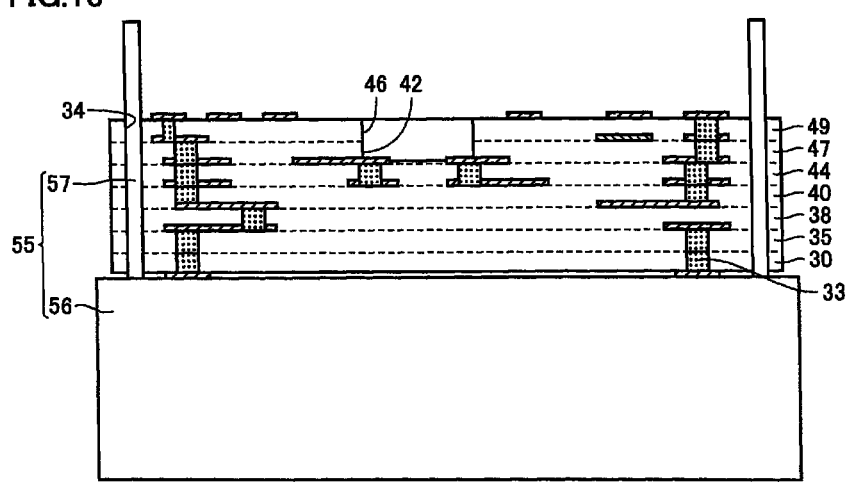

COMPONENT-EMBEDDED SUBSTRATE

TECHNICAL FIELD

The present invention relates to a component-embedded substrate, and particularly relates to a component-embedded substrate in which electronic components are mounted.

BACKGROUND ART

Recently, a variety of electronic devices such as mobile communication terminal and notebook PC have increasingly been enhanced in performance and reduced in size, and accordingly the electronic device is mounted with a semiconductor module or the like.

For example, a semiconductor module disclosed in Japanese Patent Laying-Open No. 2005-197389 includes: a substrate having an insulating layer and a conductor layer; a reinforcement portion provided in a peripheral portion of the substrate; and an electronic component provided in a component-mounted region of the substrate.

In this semiconductor module, the peripheral portion of the substrate is reinforced by the reinforcement portion provided in the peripheral portion, and occurrence of cracks to end faces of the substrate is thus suppressed.

A semiconductor module disclosed in Japanese Patent Laying-Open No. 2005-197354 includes a multilayer substrate, a cavity formed in a component-mount surface of the multilayer substrate, and an electronic component provided in this cavity. The cavity extends to a side surface of the multilayer substrate, and an end of the cavity is opened to the side surface of the multilayer substrate.

CITATION LIST

Patent Document

PTD 1: Japanese Patent Laying-Open No. 2005-197389
PTD 2: Japanese Patent Laying-Open No. 2005-197354

SUMMARY OF INVENTION

Technical Problem

The semiconductor module disclosed in Japanese Patent Laying-Open No. 2005-197389, however, has problems such as the need to provide the reinforcement portion and the reduction of the area where the electronic component is mounted.

The semiconductor module disclosed in Japanese Patent Laying-Open No. 2005-197354 also has a problem that formation of the cavity undesirably makes it more likely that cracks will occur.

The present invention has been made in view of the above problems, and an object of the invention is to provide a component-embedded substrate that enables occurrence of cracks to be suppressed.

Solution to Problem

A component-embedded substrate according to the present invention includes: a resin substrate having a mount surface and a peripheral surface surrounding a perimeter of the mount surface; a first mounted component mounted on the mount surface; a second mounted component mounted on the mount surface and spaced from the first mounted component; and at least one first embedded chip-type electronic component disposed in the resin substrate. The first embedded chip-type electronic component is located close to the peripheral surface of the resin substrate. The mount surface includes: a first region located between the first mounted component and the second mounted component and extending along a cross direction crossing an arrangement direction along which the first mounted component and the second mounted component are arranged with respect to each other; and a second region located outside the first region. The first embedded chip-type electronic component is arranged to extend in the first region and the second region as seen from above the mount surface.

Preferably, the component-embedded substrate further includes at least one second embedded chip-type electronic component disposed in the resin substrate and arranged to extend in the first region and the second region as seen from above the mount surface.

Preferably, the second embedded chip-type electronic component is arranged to extend from below the first mounted component to below the second mounted component as seen from above the mount surface.

Preferably, the first embedded chip-type electronic component is larger in size than the second embedded chip-type electronic component.

Preferably, the first embedded chip-type electronic component is located relatively closer to the peripheral surface of the resin substrate as compared with the first mounted component and the second mounted component.

Preferably, the peripheral surface includes a first side surface and a second side surface opposite to the first side surface, the first and second side surfaces being located with respect to each other along the cross direction. The first embedded chip-type electronic component includes a first chip-type electronic component located relatively closer to the first side surface as compared with the second mounted component, and a second chip-type electronic component located relatively closer to the second side surface as compared with the first mounted component.

Preferably, the resin substrate has a lower surface located opposite to the mount surface. The first embedded chip-type electronic component is located relatively closer to the mount surface than to the lower surface. Preferably, the first embedded chip-type electronic component includes a third chip-type electronic component and a fourth chip-type electronic component located relatively closer to the mount surface as compared with the third chip-type electronic component.

Preferably, the fourth chip-type electronic component is larger in size than the third chip-type electronic component.

Advantageous Effects of Invention

The component-embedded substrate of the present invention enables occurrence of cracks to be suppressed.

BRIEF DESCRIPTION OF DRAWINGS

FIG. 10 is a cross-sectional view showing the step of forming a seventh resin layer 49.

FIG. 11 is a cross-sectional view showing the step of forming an eighth resin layer 51.

FIG. 12 is a cross-sectional view showing the step of forming a topmost resin layer 53.

FIG. 13 is a cross-sectional view showing the step of laminating a plurality of resin layers.

DESCRIPTION OF EMBODIMENTS

A description will be given of a resin substrate and an electronic device having this resin substrate according to the present invention.

First Embodiment

Figure 1:
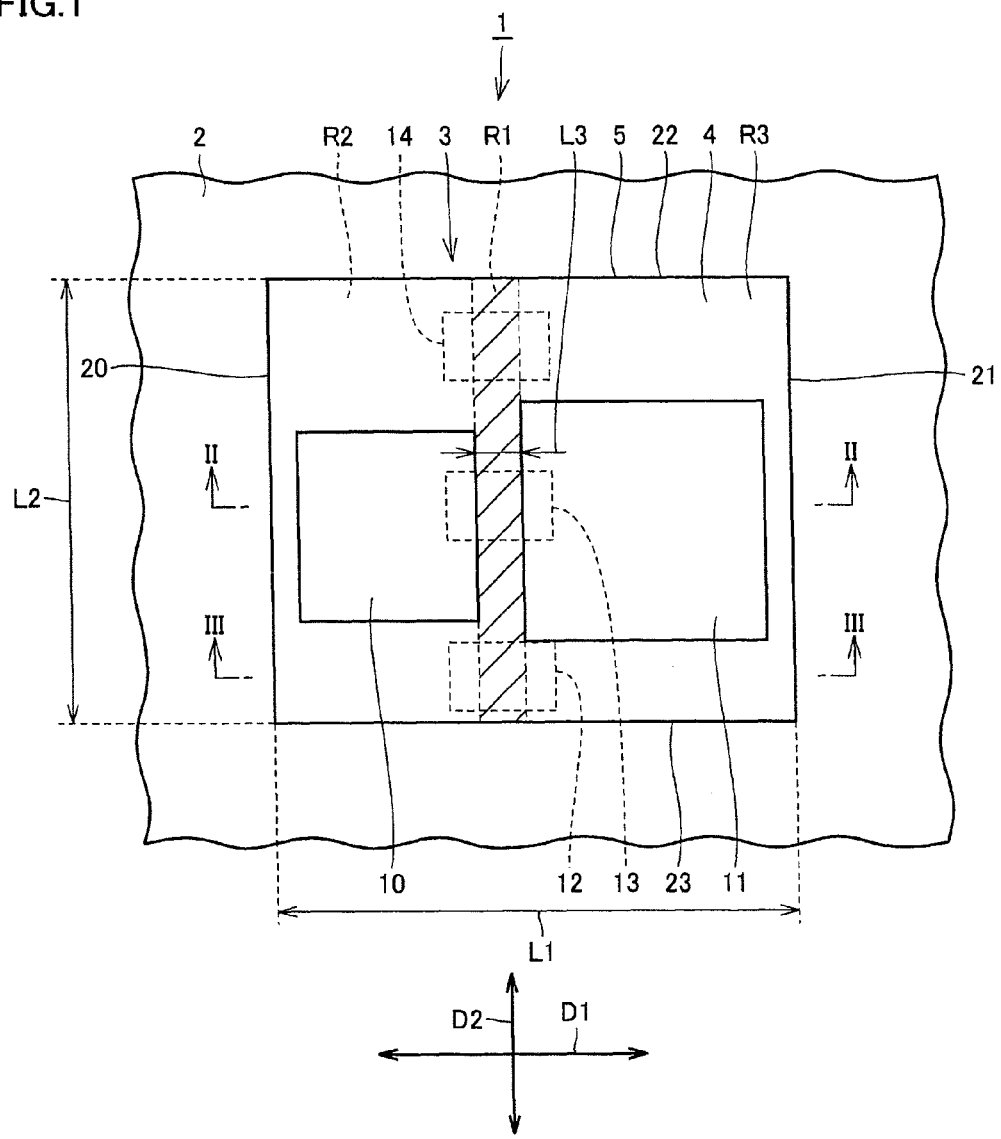
FIG. 1 is a plan view showing a part of an electronic device 1 according to a first embodiment.
Figure 2:
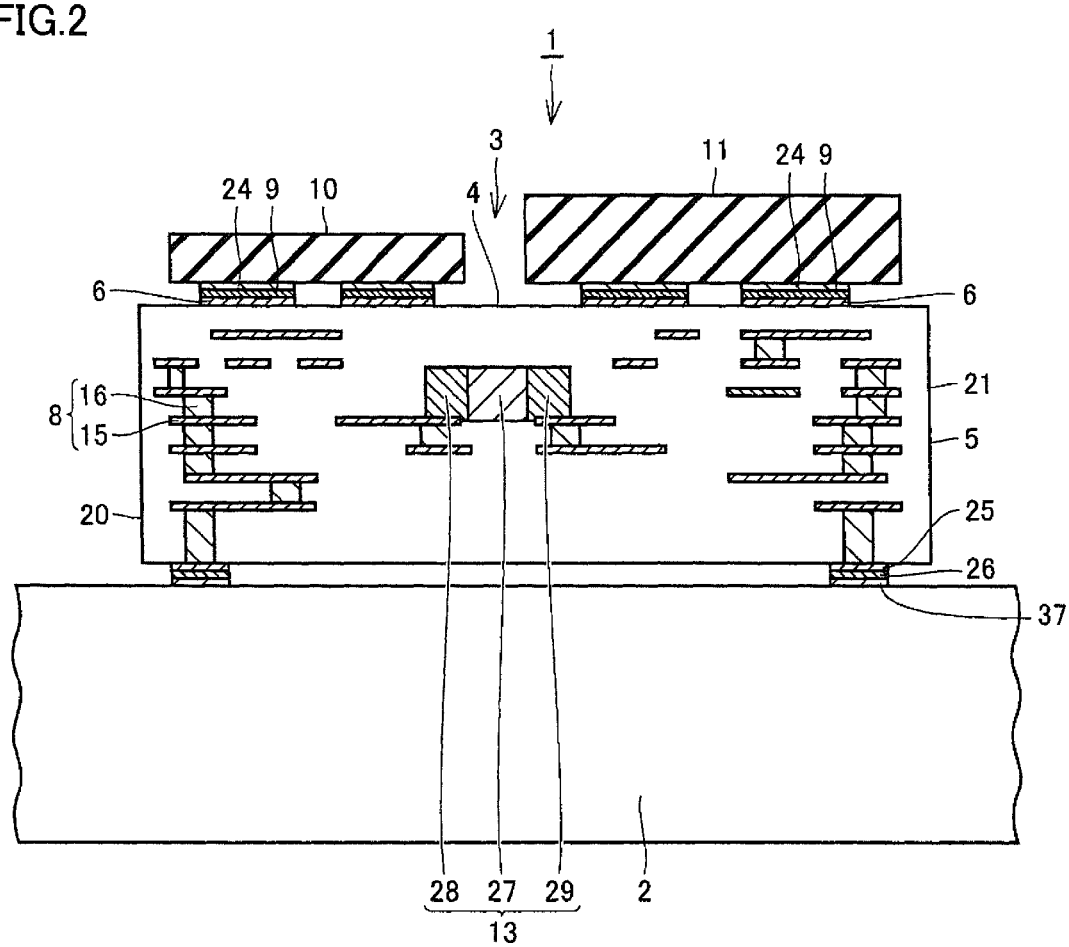
FIG. 2 is a cross-sectional view along a line II-II shown in FIG. 1.
Figure 3:
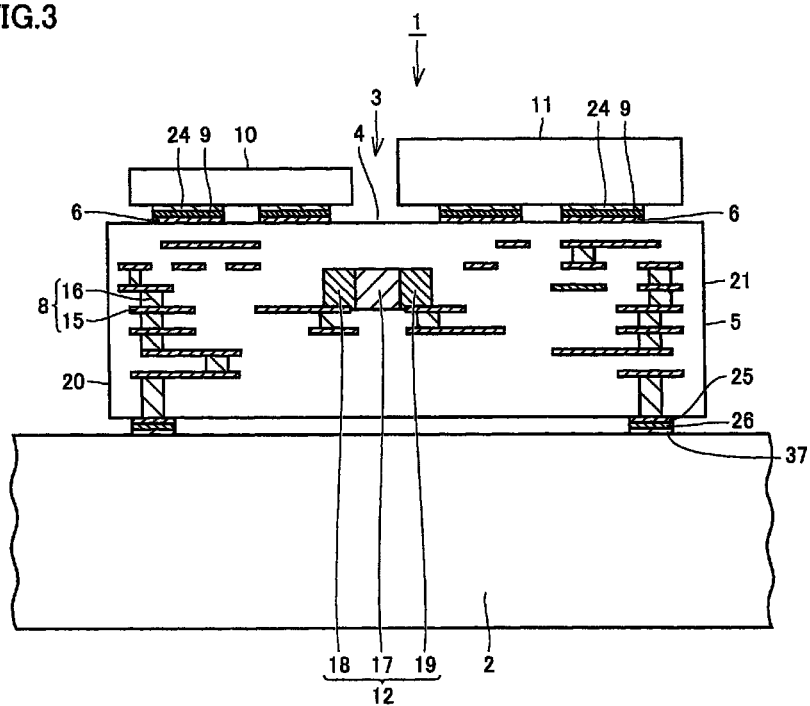
FIG. 3 is a cross-sectional view along a line III-III shown in FIG. 1.

FIG. 1 is a plan view showing a part of an electronic device 1 according to a first embodiment, and FIG. 2 is a cross-sectional view along a line II-II shown in FIG. 1. FIG. 3 is a cross-sectional view along a line III-III shown in FIG. 1.

As shown in FIG. 1, electronic device 1 includes a circuit board 2 and a component-embedded substrate 3 implemented on a main surface of circuit board 2. On the main surface of circuit board 2, a circuit interconnect 37 is formed, and component-embedded substrate 3 is connected to circuit interconnect 37 by a joint member 26 such as solder.

In FIG. 2, component-embedded substrate 3 includes a resin substrate 5 having a mount surface 4, a surface conductor 6 formed on mount surface 4, an internal conductor 8 formed in resin substrate 5, and an implemented component 10 and an implemented component 11 arranged on mount surface 4 and connected to surface conductor 6 by a joint member 9 such as solder.

Component-embedded substrate 3 includes chip-type electronic components 12, 13, 14 provided in resin substrate 5.

Resin substrate 5 is formed in a rectangular shape in the example shown in FIG. 1 for example, has a lateral length L1 of approximately 6.5 mm, for example, and a longitudinal length of approximately 5.0 mm, for example.

The peripheral surface of resin substrate 5 includes a side surface 20 and a side surface 21 that are located with respect to each other along an arrangement direction D1, and a side surface 22 and a side surface 23 that are located with respect to each other along an arrangement direction D2.

Resin substrate 5 is formed by laminating a plurality of resin layers and thereafter heating the resin layers to which pressure is being applied. As a material for the resin layers, a thermosetting resin such as epoxy resin, a thermoplastic resin such as polyimide or liquid crystal polymer, or the like is used. Thermoplastic resins such as polyimide and liquid crystal polymer are preferable since layers of a thermoplastic resin are easy to be formed into a multilayer by lamination or compression bonding. In particular, the liquid crystal polymer is suitable as the material for resin layers of a chip component-embedded resin substrate to be used for a high-frequency circuit module, since the liquid crystal polymer has a high Q factor and low water absorbency. While the thickness of each resin layer is not particularly limited, the thickness thereof is preferably 10 to 100 μm.

Surface conductor 6 is typically formed of a metal material. For example, as this metal material, a metal foil made of copper, silver, aluminum, SUS, nickel, or gold, or an alloy of any of them may be used. Preferably, a copper (Cu) foil is used since the copper foil has a low specific resistance and a small loss for a high-frequency band. While the thickness of surface conductor 6 is not particularly limited, the thickness thereof is preferably 5 to 50 μm.

Surface conductor 6 is formed on mount surface 4 of resin substrate 5, and an electrode is formed on the back surface (the surface opposite to the mount surface) of resin substrate 5. Electrode 25 is also formed of a metal material similar to that for surface conductor 6. Electrode 25 is connected to circuit interconnect 37 by a joint member 26 such as solder.

Internal conductor 8 is made up of a plurality of internal interconnects 15 and a plurality of vias 16. As a material for internal interconnect 15, a metal foil made of a metal material similar to a metal material which forms surface conductor 6, for example, may be used. Via 16 is also formed by a cured conductive paste made of a conductive metal material.

Implemented components (first and second mounted components of the present invention) 10, 11 include electrodes 24 disposed on the lower surfaces of implemented components 10, 11, and electrodes 24 of implemented components 10, 11 are each connected to surface conductor 6 by a joint member 9 such as solder. Implemented components 10, 11 are, for example, semiconductor chips. As shown in FIG. 1, implemented component 10 and implemented component 11 are spaced from each other. A length L3 between implemented component 10 and implemented component 11 is approximately 0.5 mm for example.

In mount surface 4, a region R1, a region R2, and a region R3 are defined. Region R1 is a region extending between implemented component 10 and implemented component 11 along direction D2 which crosses arrangement direction D1 along which implemented component 10 and implemented component 11 are arranged with respect to each other. Region R1 extends from side surface 20 to side surface 21. Region R1 is located between a portion of implemented component 10 that is closest to implemented component 11 and a portion of implemented component 11 that is closest to implemented component 10. In the example shown in FIG. 1, implemented component 10 and implemented component 11 are each formed in the shape of a substantially rectangular parallelepiped. Thus, region R1 is located between a side portion of the peripheral portion of implemented component 10 that is closest to implemented component 11, and a side portion of implemented component 11 that is closest to implemented component 10.

Region R2 is a region located opposite to implemented component 11 with respect to region R1. Region R3 is a region located opposite to implemented component 10 with respect to region R1.

Chip-type electronic components 12, 13, 14 are embedded in resin substrate 5. These chip-type electronic components 12, 13, 14 are each a rectangular component body having side surfaces provided with side terminal electrodes.

Examples of chip-type electronic components 12, 13, 14 include passive components such as chip-type capacitor, chip-type resistor, and chip-type inductor, and active components such as IC, for example.

In connection with the present embodiment, an example will be described where chip-type capacitors are employed as chip-type electronic components 12, 13, 14. In the first embodiment, chip-type electronic components 12, 13, 14 each has a lateral dimension of 0.6 mm, a longitudinal dimension of 0.3 mm, and a height dimension of 0.15 mm. These dimensions are given herein by way of example. Components designed to have other dimensions may also be employed.

In FIG. 2, chip-type electronic component 13 includes a dielectric body 27 having an internal electrode, an electrode 28 disposed on one side surface of dielectric body 27, and an electrode 29 disposed on the other side surface of dielectric body 27. Electrodes 28, 29 are each formed of a laminated metal film of Ni (nickel) and Sn (tin), or the like.

In FIG. 3, chip-type electronic component 12 includes a dielectric body 17 having an internal electrode, an electrode 18 disposed on one side surface of dielectric body 17, and an electrode 19 disposed on the other side surface of dielectric body 17. Electrodes 18, 19 are each formed of a laminated metal film of Ni (nickel) and Sn (tin), or the like. Chip-type electronic component 14 is configured similarly to chip-type electronic components 12, 13.

In FIG. 1, chip-type electronic component 12 is located relatively closer to side surface 23 as compared with implemented components 10, 11. In the plan view of component-embedded substrate 3 as seen from above mount surface 4, chip-type electronic component 12 is arranged to extend from region R2 across region R1 to region R3.

In the plan view of component-embedded substrate 3 as seen from above mount surface 4, chip-type electronic component 13 is arranged to extend from below mounted component 10 across region R1 to below mounted component 11.

Chip-type electronic component 14 is arranged relatively closer to side surface 22 as compared with implemented components 10, 11. In the plan view of component-embedded substrate 3 as seen from above mount surface 4, chip-type electronic component 14 is arranged to extend from region R2 across region R1 to region R3. Chip-type electronic component 12 and chip-type electronic component 14 are located relatively closer to the outer periphery of mount surface 4 as compared with chip-type electronic component 13.

In FIGS. 2 and 3, chip-type electronic components 12, 13, 14 are located relatively closer to mount surface 4 than to the lower surface of resin substrate 5.

The elastic modulus of resin substrate 5 is higher than the elastic modulus of implemented component 10 and implemented component 11 and the elastic modulus of chip-type electronic components 12, 13, 14. The size of resin substrate 5 is larger than the size of implemented components 10, 11 and chip-type electronic components 12, 13, 14.

A description will be given of a case where an impact force is externally applied to electronic device 1 and component-embedded substrate 3 configured in the above-described manner. The case where an impact force is applied to electronic device 1 and component-embedded substrate 3 may be the one where a user drops a mobile terminal or the like which is mounted with electronic device 1 and component-embedded substrate 3.

At this time, because the elastic modulus of resin substrate 5 is higher than the elastic modulus of implemented components 10, 11, the impact force applied to component-embedded substrate 3 causes a flexure stress due to a flexure impact to be applied to resin substrate 5, so that a part of resin substrate 5, specifically the part located between implemented component 10 and implemented component 11, is subjected to a large stress.

Regarding region R2, implemented component 10 is implemented in region R2 and therefore the flexure stress is less likely to occur to region R2 even when an impact force is applied thereto. Regarding region R3 as well, implemented component 11 is provided in region R3 and therefore the flexure stress is less likely to occur to region R3 even when an impact force is applied thereto. As a result, stress is likely to concentrate chiefly on the end of region R1 on the side surface 22 side and the end of region R1 on the side surface 23 side.

Meanwhile, chip-type electronic component 12 connects the end of region R1 on the side surface 23 side with regions R2, R3 where flexure is less likely to occur, and thus the end of region R1 on the side surface 23 side is reinforced by chip-type electronic component 12.

Further, chip-type electronic component 14 connects the end of region R1 on the side surface 22 side with regions R2, R3 where flexure is less likely to occur, and thus the end of region R1 on the side-surface 22 side is reinforced by chip-type electronic component 14.

Therefore, even when an impact force is applied to component-embedded substrate 3, generation of crack sources in the portions of side surfaces 22, 23 where the ends of region R1 are located respectively can be suppressed, and damage to component-embedded substrate 3 can be suppressed. Accordingly, occurrence of cracks to component-embedded substrate 3 can surely be suppressed without the need to provide a special reinforcement member or the like.

Chip-type electronic component 13 connects the portion of region R1 that is located between implemented component 10 and implemented component 11 with regions R2, R3 where flexure is less likely to occur, to thereby reinforce the portion of region R1 that is located between implemented component 10 and implemented component 11.

As seen from the above, electronic device 1 and component-embedded substrate 3 of the present embodiment enable damage to component-embedded substrate 3 to be suppressed even when an impact force is externally applied to electronic device 1 and component-embedded substrate 3.

It should be noted here that when an impact force is applied to component-embedded substrate 3, a greater flexure stress is exerted on the mount surface 4 side of resin substrate 5, since implemented component 10 and implemented component 11 are disposed on mount surface 4.

Regarding component-embedded substrate 3 of the first embodiment, chip-type electronic components 12, 13, 14 are located relatively closer to mount surface 4 than to the lower surface of resin substrate 5, and thus the mount surface 4 side of resin substrate 5 is reinforced by chip-type electronic components 12, 13, 14.

Therefore, even when an impact force is applied to resin substrate 5, occurrence of cracks to resin substrate 5 can effectively be suppressed.

A description will be given, using FIGS. 4 to 17, of a method for manufacturing component-embedded substrate 3 and electronic device 1 configured in the above-described manner.

The method for manufacturing component-embedded substrate 3 generally includes: the step of forming a plurality of resin layers; the step of laminating the plurality of resin layers; the step of heating the plurality of resin layers to thereby form a first substrate in which cavities are formed that are to receive chip-type electronic components 12, 13, 14; and the step of causing chip-type electronic components 12, 13, 14 to be received in this first substrate. The method for manufacturing component-embedded substrate 3 further includes the step of laminating a plurality of resin layers on the first substrate in which chip-type electronic components 12, 13, 14 are received, and the step of performing a heat treatment after the plurality of resin layers is formed on chip-type electronic components 12, 13, 14.

FIGS. 4 to 12 are cross-sectional views showing respective steps for manufacturing respective resin layers.

Figure 4:
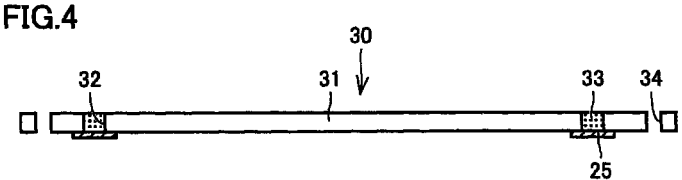
FIG. 4 is a cross-sectional view showing the step of forming a first resin layer 30.

FIG. 4 is a cross-sectional view showing the step of forming a first resin layer 30. When resin layer 30 is to be formed, a resin sheet 31 is initially prepared so that it has a surface where a metal film made up of a metal foil of copper (Cu) or the like is formed and it has a corner where a hole 34 is formed. Thereafter, the metal film is patterned by etching or the like to form an electrode 25 on resin sheet 31. Next, in resin sheet 31, a via hole 32 is formed by means of a laser or the like. Next, via hole 32 is filled with a paste 33 containing metal powder and an organic solvent or the like. In this way, resin layer 30 shown in FIG. 4 is formed. In hole 34, a columnar part of a mold is to be inserted, as described later herein, and hole 34 is formed in a corner, for example, of resin layer 30.

Figure 5:
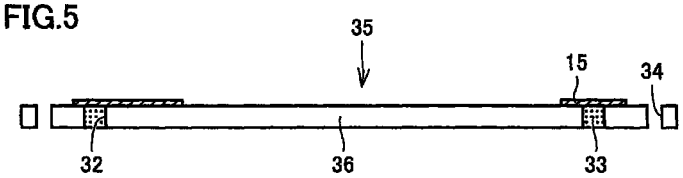
FIG. 5 is a cross-sectional view showing the step of forming a second resin layer 35.
Figure 6:
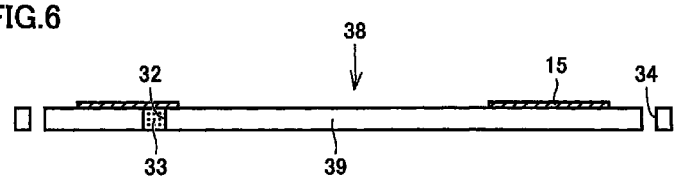
FIG. 6 is a cross-sectional view showing the step of forming a third resin layer 38.

FIG. 5 is a cross-sectional view showing the step of forming a second resin layer 35, and FIG. 6 is a cross-sectional view showing the step of forming a third resin layer 38.

When resin layers 35, 38 are to be formed, resin sheets 36, 39 are initially prepared so that each has an upper surface where a metal film made up of a metal foil is formed, and the metal film is patterned by etching to form an internal interconnect 15. Next, in resin sheets 36, 39, via holes 32 are formed, and the via holes are filled with paste 33. In this way, resin layers 35, 38 are formed.

Figure 7:
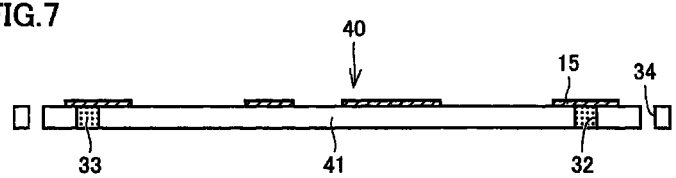
FIG. 7 is a cross-sectional view showing the step of forming a fourth resin layer 40.
Figure 8:
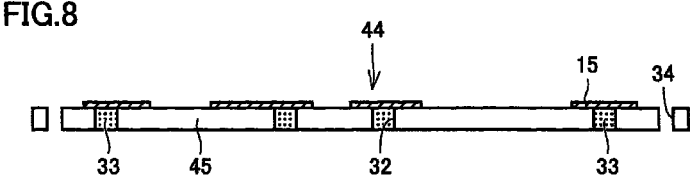
FIG. 8 is a cross-sectional view showing the step of forming a fifth resin layer 44.

FIG. 7 is a cross-sectional view showing the step of forming a fourth resin layer 40, and FIG. 8 is a cross-sectional view showing the step of forming a fifth resin layer 44. In FIGS. 7 and 8, when resin layers 40, 44 are to be formed, resin sheets 41, 45 are initially prepared so that each has an upper surface where a metal film is formed. Next, respective metal films are etched to form internal interconnects 15 on respective upper surfaces of resin sheets 41, 45.

Next, in resin sheets 41, 45, via holes 32 are formed by means of a laser. Then, via holes 32 are filled with paste 33. In this way, resin layer 40 and resin layer 44 are formed.

Figure 9:
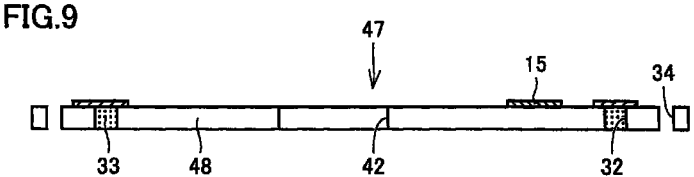
FIG. 9 is a cross-sectional view showing the step of forming a sixth resin layer 47.

FIG. 9 is a cross-sectional view showing the step of forming a sixth resin layer 47, and FIG. 10 is a cross-sectional view showing the step of forming a seventh resin layer 49. FIG. 11 is a cross-sectional view showing the step of forming an eighth resin layer 51.

In FIGS. 9 to 11, when resin layers 47, 49, 51 are to be formed, resin sheets 48, 50, 52 are initially prepared so that each has an upper surface where a metal film is formed. Next, respective metal films are etched to form internal interconnects 15.

Next, in resin sheets 48, 50, 52, via holes 32 are formed by means of a laser. Then, via holes 32 are filled with paste 33. In this way, resin layer 51 is formed.

Next, in resin sheets 48 and 50, hole portions 42 and 46 are formed by punching resin sheets 41 and 45 by means of a mold, respectively. In this way, resin layer 47 and resin layer 49 are formed.

FIG. 12 is a cross-sectional view showing the step of forming a topmost resin layer 53. In FIG. 12, when resin layer 53 is to be formed, initially a resin sheet 54 is prepared that has a top surface where a metal film made up of a metal foil is formed. Next, the metal film is patterned to form surface conductor 6. Next, a hole 34 is formed in resin sheet 54 by means of a laser. In this way, resin layer 53 is formed.

FIG. 13 is a cross-sectional view showing the step of laminating a plurality of resin layers. As shown in FIG. 13, when the resin layers are to be laminated, a mold 55 is used to laminate the plurality of resin layers.

Mold 55 includes a platform 56 and a plurality of columnar parts 57 provided on the upper surface of platform 56. In the step shown in FIG. 13, resin layers 30, 35, 38, 40, 44, 47, 49 are laminated on the upper surface of mold 55.

At this time, a columnar part 57 is inserted in holes 34 formed respectively in resin layers 30, 35, 38, 40, 44, 47, 49. When resin layers 30, 35, 38, 40, 44, 47, 49 have been laminated, hole portion 42 and hole portion 46 are aligned.

Figure 14:
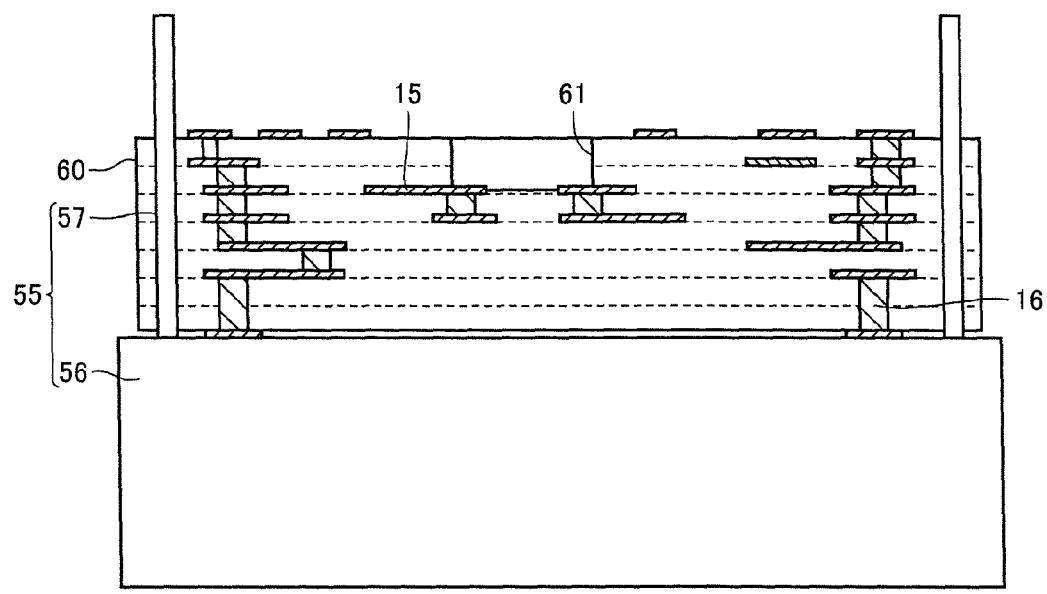
FIG. 14 is a cross-sectional view showing the step after the step shown in FIG. 13.

FIG. 14 is a cross-sectional view showing the step after the step shown in FIG. 13. As shown in FIG. 14, a laminated body which is made up of the laminated resin layers is pressurized, and the laminated body in this state is subjected to a heat treatment. The heating temperature of the heat treatment is lower than the heating temperature in the step of uniting an intermediate substrate 60 and resin layers 51, 53 into a single body, which is performed later. Specifically, the laminated body is heat-treated at a temperature that will not cause each resin layer to flow. This heat treatment can enhance adhesion between the resin layers, and displacement of resin layers from each other is suppressed when chip-type electronic components 12, 14 are inserted.

In this way, intermediate substrate 60 is formed. In the upper surface of intermediate substrate 60, a cavity 61 is formed.

While the cross section shown in FIG. 14 illustrates only cavity 61 in which chip-type electronic component 13 is to be inserted, a cavity in which chip-type electronic component 12 is to be inserted and a cavity in which chip-type electronic component 14 is to be inserted are also formed in intermediate substrate 60. On the bottom surface of cavity 61, a part of internal interconnect 15 is exposed.

Figure 15:
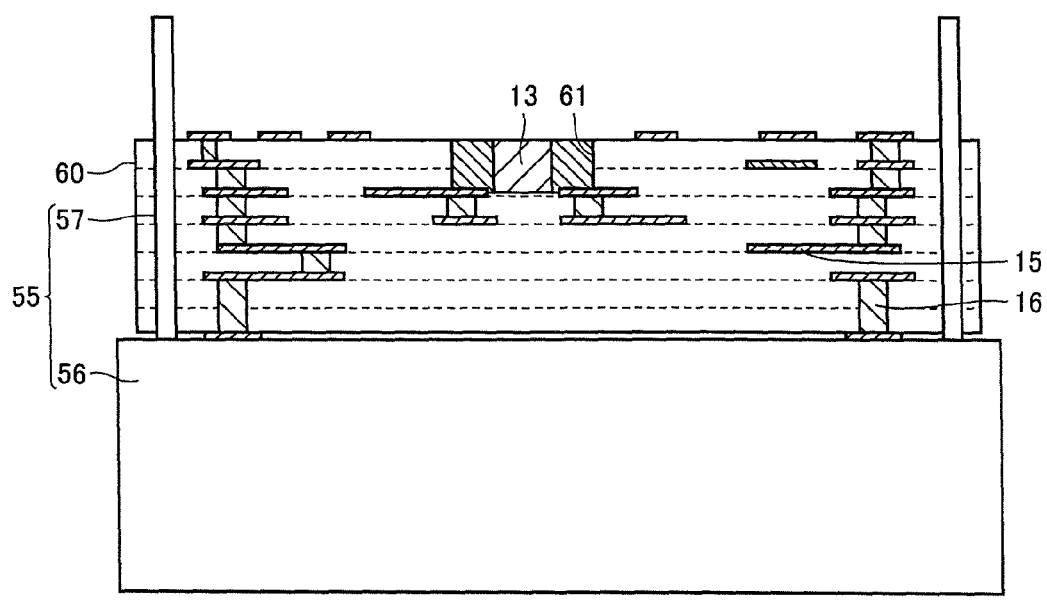
FIG. 15 is a cross-sectional view showing the manufacture step after the step shown in FIG. 14.

FIG. 15 is a cross-sectional view showing the manufacture step after the step shown in FIG. 14. As shown in FIG. 15, chip-type electronic component 13 is inserted in cavity 61. Similarly, chip-type electronic component 12 and chip-type electronic component 14 are inserted in the other cavities.

Figure 16:
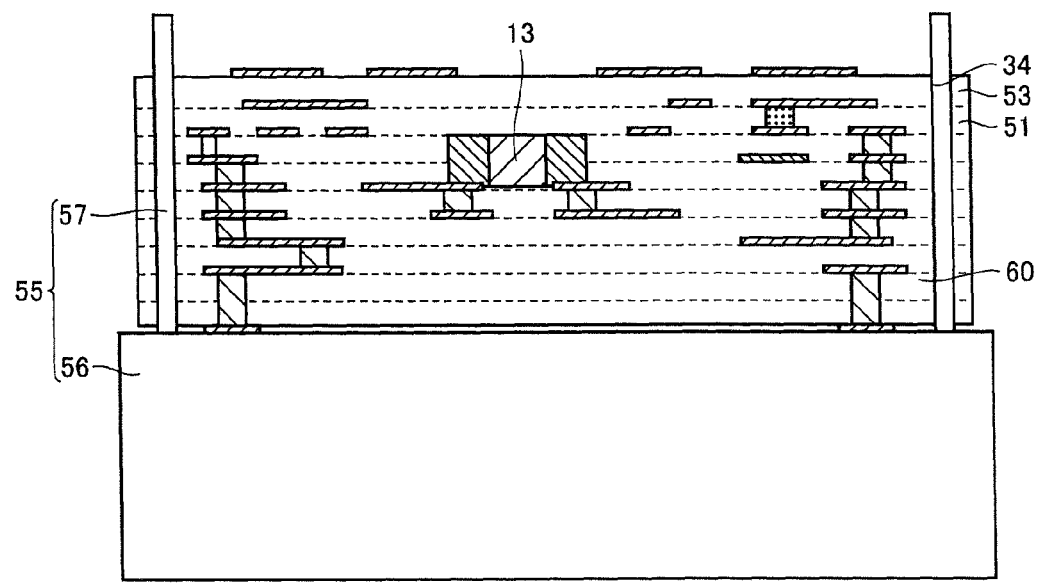
FIG. 16 is a cross-sectional view showing the manufacture step after the step shown in FIG. 15.

FIG. 16 is a cross-sectional view showing the manufacture step after the step shown in FIG. 15. As shown in FIG. 16, on the upper surface of intermediate substrate 60 in which chip-type electronic components 12, 13, 14 have been inserted, resin layers 51, 53 are laminated successively. In holes 34 formed in resin layers 51, 53, columnar part 57 is inserted.

Figure 17:
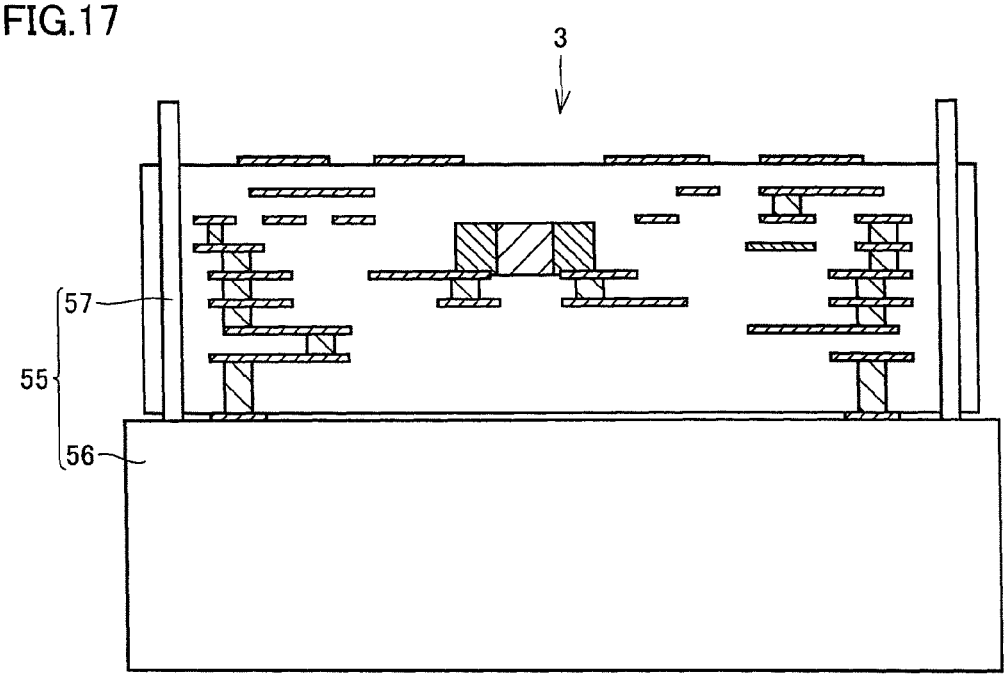
FIG. 17 is a cross-sectional view showing the manufacture step after the step shown in FIG. 16.

FIG. 17 is a cross-sectional view showing the manufacture step after the step shown in FIG. 16. As shown in FIG. 17, with a plurality of resin layers 51, 53 laminated on the upper surface of intermediate substrate 60, intermediate substrate 60 and resin layers 51, 53 are pressurized and also subjected to a heat treatment. With the laminated body pressurized, the heat treatment performed on the laminated body causes each resin layer to soften and flow, so that the resin layers are compression-bonded to each other. The compression bonding causes at least respective surfaces of the resin layers to be united together, and the paste 33 with which each via hole 32 is filled forms via 16.

Accordingly, resin layers 30, 35, 38, 40, 44, 47, 49, 51, 53 are united together into a single body. After this, implemented component 10 and implemented component 11 are implemented on surface conductors 6 of component-embedded substrate 3 by means of solder or the like. Then, the portion where hole 34 is formed is removed to thereby form component-embedded substrate 3. After this, as shown in FIG. 3, component-embedded substrate 3 is implemented on circuit board 2 to thereby form electronic device 1.

While the steps for manufacturing a single component-embedded substrate 3 have been described in connection with the present embodiment, a plurality of component-embedded substrates 3 may be obtained by simultaneously forming, in large resin layers that are to form a mother substrate, internal interconnects 15 and the like for a plurality of component-embedded substrates, simultaneously laminating the resin layers, and then cutting the resultant laminated body into pieces for respective component-embedded substrates.

Second Embodiment

A description will be given, using FIGS. 18 to 20, of an electronic device 1a and a component-embedded substrate 3a according to the present embodiment. Of the constituent components shown in FIG. 18, any component identical or corresponding to the component shown in any of FIGS. 1 to 17 is denoted by the same reference character, and the description thereof may not be repeated.

Figure 18:
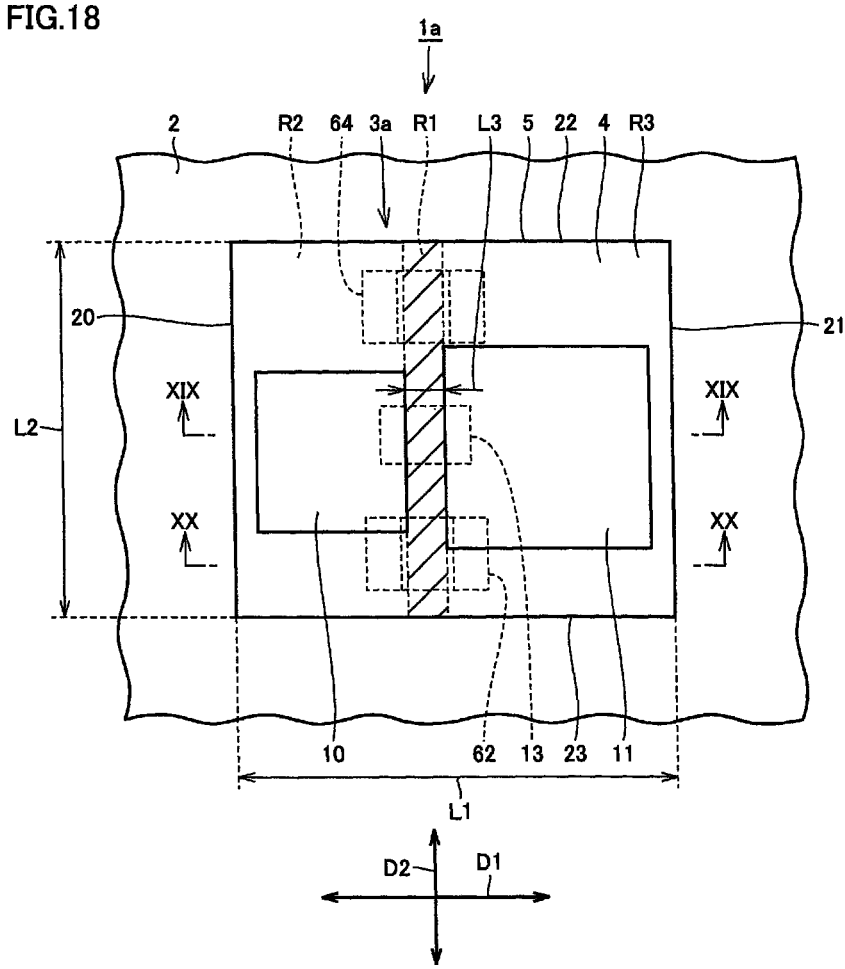
FIG. 18 is a plan view showing an electronic device 1a according to a second embodiment.

FIG. 18 is a plan view showing electronic device 1a according to the second embodiment. As shown in FIG. 18, component-embedded substrate 3a includes a resin substrate 5, a chip-type electronic component 62 disposed in resin substrate 5, a chip-type electronic component 13 disposed in resin substrate 5, and a chip-type electronic component 64 disposed in resin substrate 5.

Figure 19:
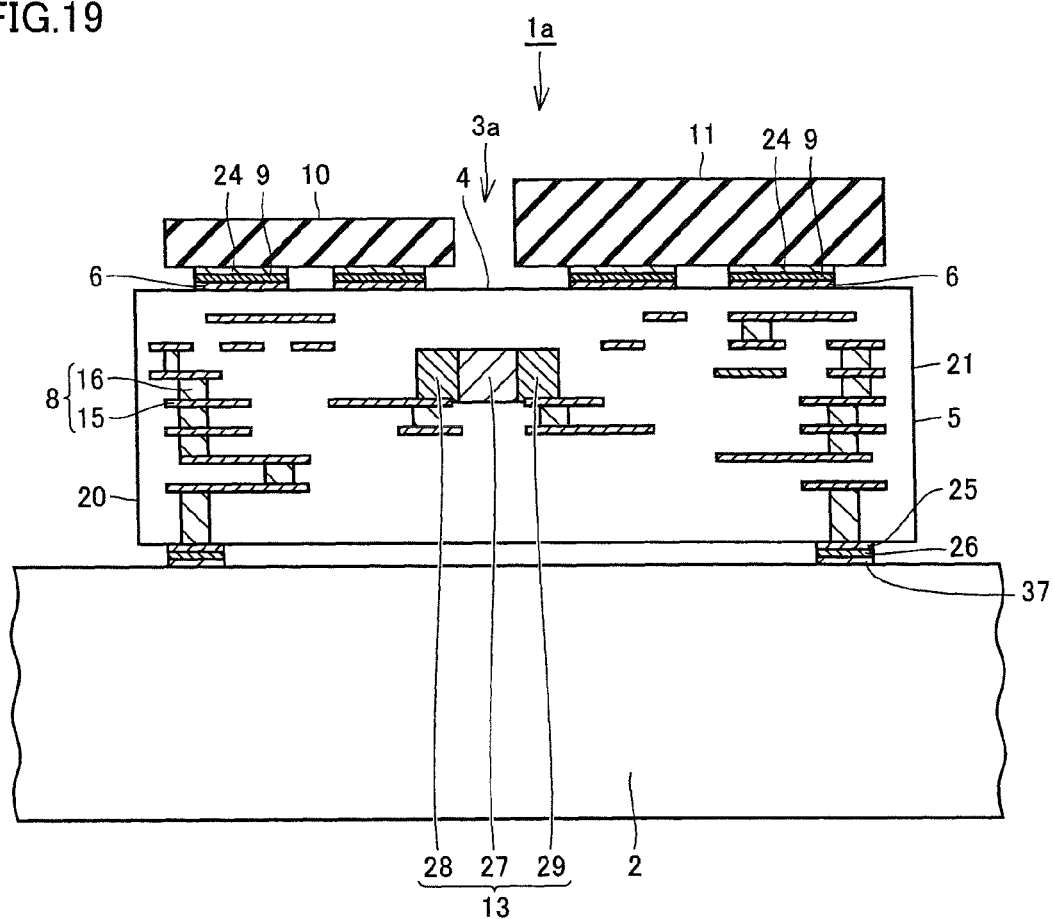
FIG. 19 is a cross-sectional view along a line XIX-XIX shown in FIG. 18.

FIG. 19 is a cross-sectional view along a line XIX-XIX shown in FIG. 18. As shown in FIG. 19, in the second embodiment as well, an internal conductor 8 and the like are formed in component-embedded substrate 3a. Chip-type electronic component 13 is disposed in resin substrate 5 and located relatively closer to mount surface 4 than to the lower surface of resin substrate 5.

Figure 20:
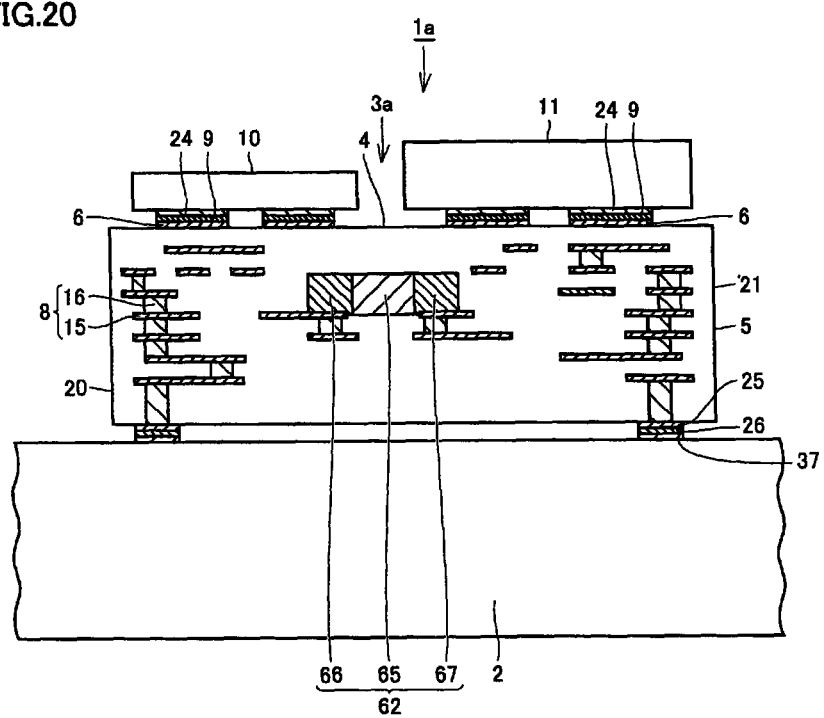
FIG. 20 is a cross-sectional view along a line XX-XX shown in FIG. 18.

FIG. 20 is a cross-sectional view along a line XX-XX shown in FIG. 18. As shown in FIG. 20, chip-type electronic component 62 is disposed in resin substrate 5. Chip-type electronic component 62 includes a dielectric body 65 and an electrode 66 disposed on one side surface of dielectric body 65. Chip-type electronic component 64 is configured similarly to chip-type electronic component 62.

In FIG. 18, in the plan view of component-embedded substrate 3a as seen from above mount surface 4, chip-type electronic component 62 is arranged to extend from region R2 across region R1 to region R3.

Chip-type electronic component 62 is located relatively closer to side surface 23 of resin substrate 5 as compared with implemented component 10 and implemented component 11. In the second embodiment, in the plan view of component-embedded substrate 3a as seen from above mount surface 4, chip-type electronic component 62 and implemented components 10, 11 are arranged so that chip-type electronic component 62 partially overlaps a part of implemented component 10 and a part of implemented component 11.

Chip-type electronic component 64 is located relatively closer to side surface 22 as compared with implemented component 10 and implemented component 11. Chip-type electronic component 64 is arranged to extend from region R2 across region R1 to region R3.

Chip-type electronic component 62 and chip-type electronic component 64 are located relatively closer to the peripheral surface of resin substrate 5 as compared with chip-type electronic component 13. The size of chip-type electronic component 62 and chip-type electronic component 64 is larger than the size of chip-type electronic component 13.

For example, the dimensions of chip-type electronic component 13 are 0.6 mm×0.3 mm×0.15 mm. The dimensions of chip-type electronic components 62, 64 are 1.0 mm×0.5 mm×0.15 mm.

Thus, component-embedded substrate 3a includes chip-type electronic component 13 arranged to extend in the region of implemented component 10 and the region of implemented component 11, and chip-type electronic components 62, 64 arranged relatively closer to the outer periphery of resin substrate 5 as compared with chip-type electronic component 13 and located respectively on the ends of region R1. The size of chip-type electronic components 62, 64 is larger than that of chip-type electronic component 13.

Accordingly, the ends of region R1 that are located respectively on the side surface 22 side and the side surface 23 side are well reinforced by chip-type electronic components 62, 64, and damage to resin substrate 5 can be suppressed even when an impact force is applied to component-embedded substrate 3a. Namely, chip-type electronic component 62 and chip-type electronic component 64 that are located relatively closer to the peripheral surface are sized larger than chip-type electronic component 13 located in another portion, to thereby enable the effect of suppressing occurrence of cracks to further be enhanced. For example, in the case where a plurality of chip-type electronic components is to be embedded, the above-described design may be employed, so that occurrence of cracks to the component-embedded substrate can more surely be suppressed without the need to provide a special reinforcement member or the like.

Third Embodiment

Using FIG. 21, a description will be given of an electronic device 1b and a component-embedded substrate 3b according to a third embodiment. Of the constituent components shown in FIG. 21, any component identical or corresponding to the component shown in any of FIGS. 1 to 20 is denoted by the same reference character, and the description thereof may not be repeated.

Figure 21:
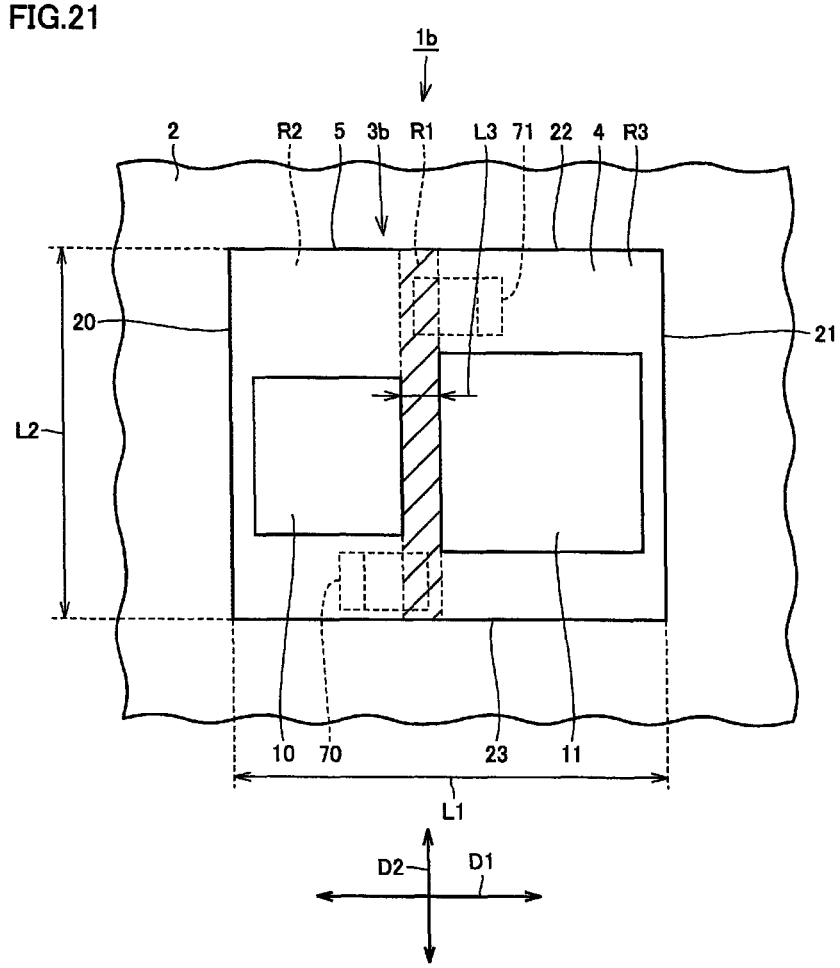
FIG. 21 is a plan view showing an electronic device 1b according to a third embodiment.

FIG. 21 is a plan view showing electronic device 1b according to the third embodiment. As shown in FIG. 21, component-embedded substrate 3b includes a resin substrate 5, a chip-type electronic component 70 disposed in resin substrate 5, and a chip-type electronic component 71 disposed in resin substrate 5.

Chip-type electronic component 70 is arranged relatively closer to side surface 23 as compared with implemented component 10 and implemented component 11. In the plan view of resin substrate 5 as seen from above mount surface 4, chip-type electronic component 70 is arranged to extend from region R1 to region R2.

The end of region R1 that is located on the side surface 23 side is thus reinforced by chip-type electronic component 70. Chip-type electronic component 71 is located relatively closer to side surface 22 as compared with implemented component 10 and implemented component 11.

In the plan view of resin substrate 5 as seen from above mount surface 4, chip-type electronic component 71 is arranged to extend in region R1 and region R3. The end of region R1 that is located on the side surface 22 side is reinforced by chip-type electronic component 71.

Therefore, regarding electronic device 1b and component-embedded substrate 3b of the third embodiment as well, damage to resin substrate 5 can be suppressed even when an impact force is externally applied.

As seen from the above, the chip-type electronic component located relatively closer to the peripheral surface of resin substrate 5 as compared with implemented component 10 and implemented component 11 is arranged to extend in at least one of regions R2 and R3, which are located outside region R1, and also in region R1. Namely, the chip-type electronic component may not be arranged to extend in all of regions R1, R2, R3, but be arranged to extend into at least one of regions R2 and R3 which are located outside region R1, to thereby achieve the effects of the present invention.

Fourth Embodiment

Using FIGS. 22 to 24, a description will be given of an electronic device 1c and a component-embedded substrate 3c according to a fourth embodiment. Of the constituent components shown in FIGS. 22 to 24, any component identical or corresponding to the component shown in any of FIGS. 1 to 21 is denoted by the same reference character, and the description thereof may not be repeated.

Figure 22:
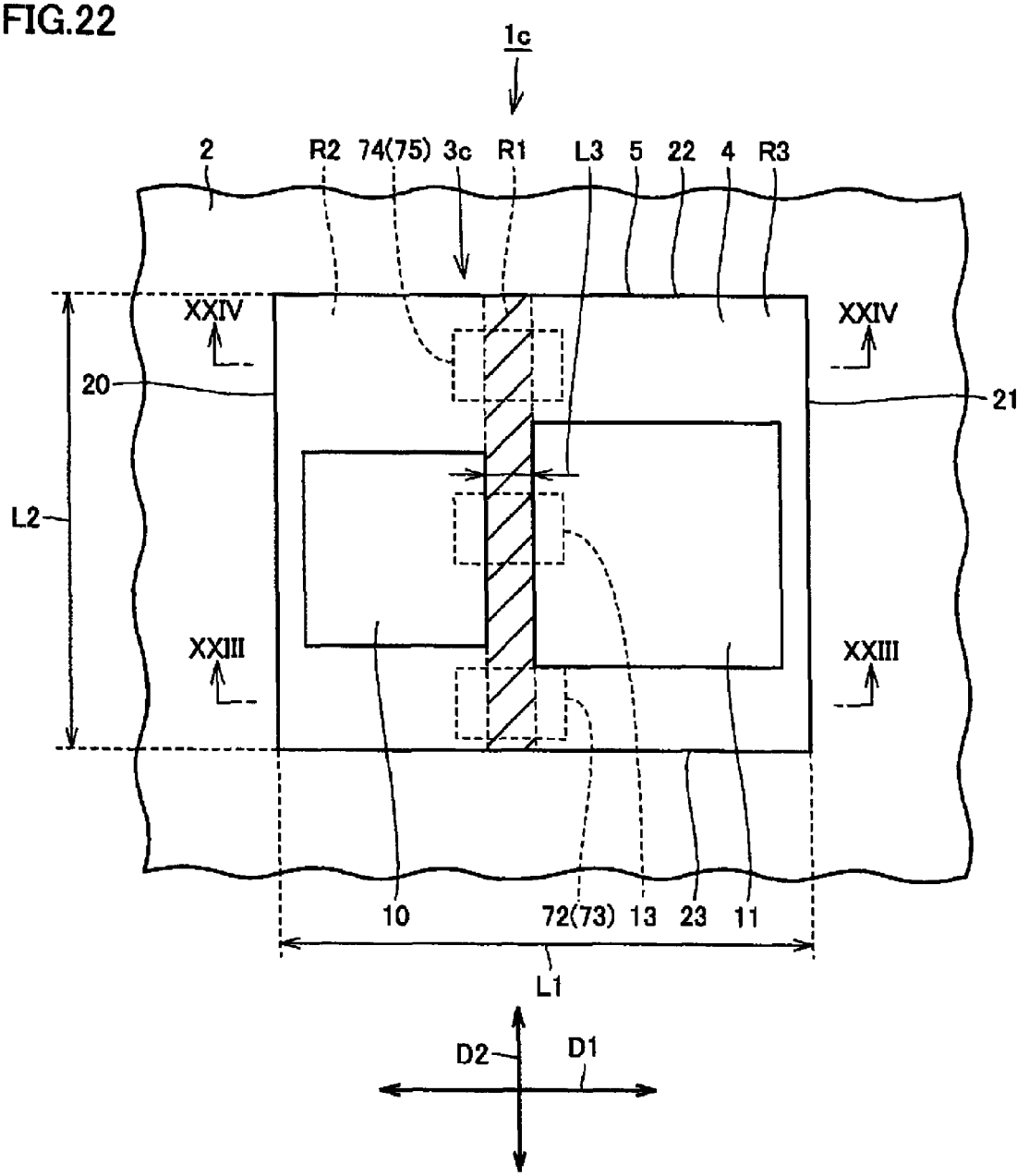
FIG. 22 is a plan view showing an electronic device 1c according to a fourth embodiment.

FIG. 22 is a plan view showing electronic device 1c according to the fourth embodiment. As shown in FIG. 22, component-embedded substrate 3c includes chip-type electronic components 72, 73, 74, 75 disposed in resin substrate 5, and a chip-type electronic component 13 disposed in resin substrate 5.

Figure 23:
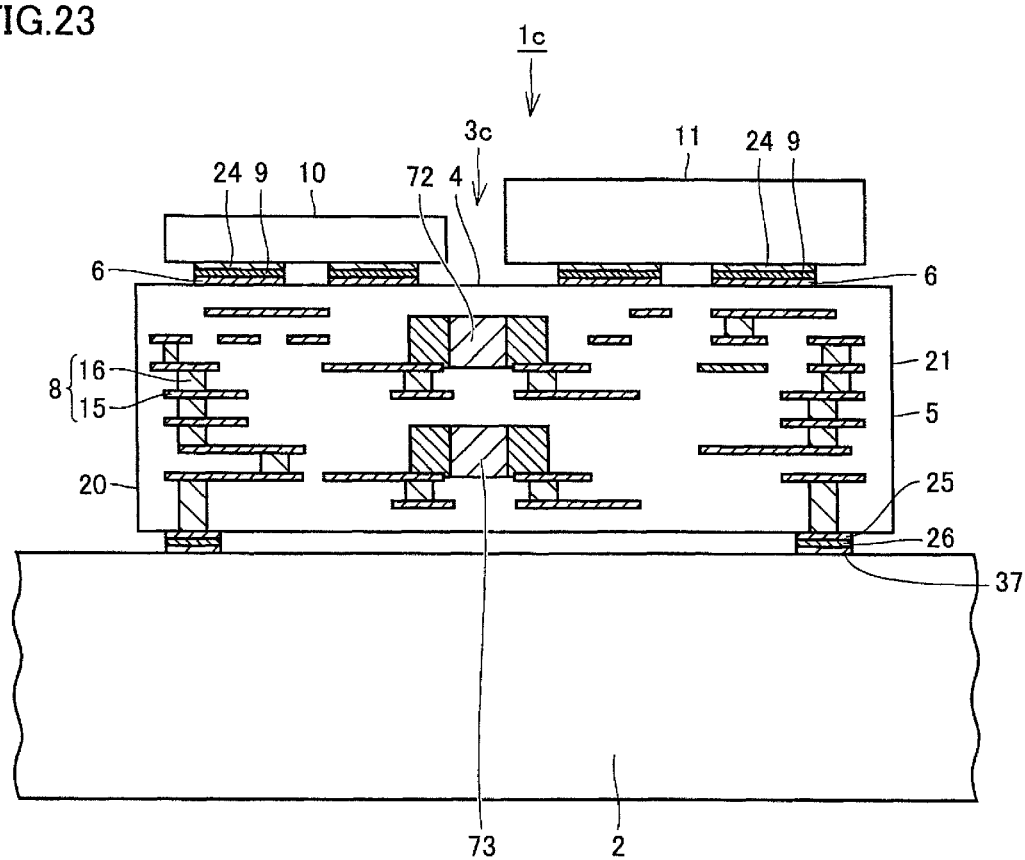
FIG. 23 is a cross-sectional view along a line XXIII-XXIII shown in FIG. 22.

FIG. 23 is a cross-sectional view along a line XXIII-XXIII shown in FIG. 22. As shown in FIG. 23, chip-type electronic component 72 and chip-type electronic component 73 are aligned in the thickness direction of component-embedded substrate 3c.

Chip-type electronic component 72 and chip-type electronic component 73 are located relatively closer to side surface 23 as compared with implemented components 10, 11, as shown in FIG. 22. In the plan view of component-embedded substrate 3c as seen from above mount surface 4, chip-type electronic component 72 and chip-type electronic component 73 are arranged to extend from region R2 across region R1 to region R3.

Thus, a portion of side surface 23 where an end of region R1 is located is reinforced by chip-type electronic component 72 and chip-type electronic component 73.

Figure 24:
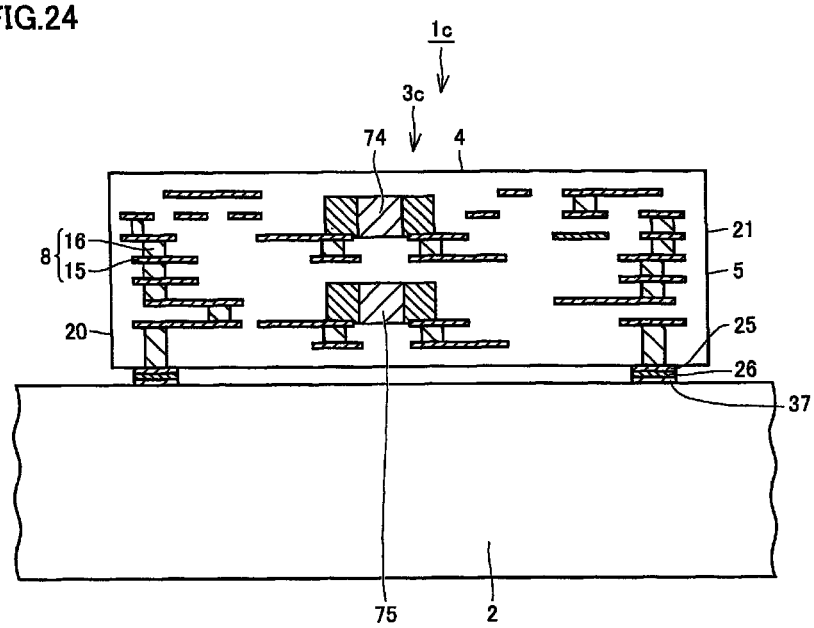
FIG. 24 is a cross-sectional view along a line XXIV-XXIV shown in FIG. 22.

FIG. 24 is a cross-sectional view along a line XXIV-XXIV shown in FIG. 22. As shown in FIG. 24, chip-type electronic component 74 and chip-type electronic component 75 are aligned in the thickness direction of resin substrate 5.

As shown in FIG. 22, in the plan view of resin substrate 5 as seen from above mount surface 4, chip-type electronic component 74 and chip-type electronic component 75 are located relatively closer to side surface 22 as compared with implemented component 10 and implemented component 11.

Chip-type electronic component 74 and chip-type electronic component 75 are arranged to extend from region R2 across region R1 to region R3.

Thus, a portion of side surface 22 where an end of region R1 is located is reinforced by chip-type electronic component 74 and chip-type electronic component 75.

In the fourth embodiment, chip-type electronic component 74 and chip-type electronic component 75 are aligned in the thickness direction of resin substrate 5 and chip-type electronic component 72 and chip-type electronic component 73 are arranged in the thickness direction. They, however, may not have to be aligned particularly in the thickness direction.

In other words, chip-type electronic component 74 and chip-type electronic component 75 may be displaced from each other in the direction of the plane of mount surface 4.

Likewise, chip-type electronic component 72 and chip-type electronic component 73 may be displaced from each other in the direction of the plane of mount surface 4.

Fifth Embodiment

Using FIGS. 25 to 27, a description will be given of an electronic device 1d and a component-embedded substrate 3d according to a fifth embodiment. Of the constituent components shown in FIGS. 25 to 27, any component identical or corresponding to the component shown in any of FIGS. 1 to 24 is denoted by the same reference character, and the description thereof may not be repeated.

Figure 25:
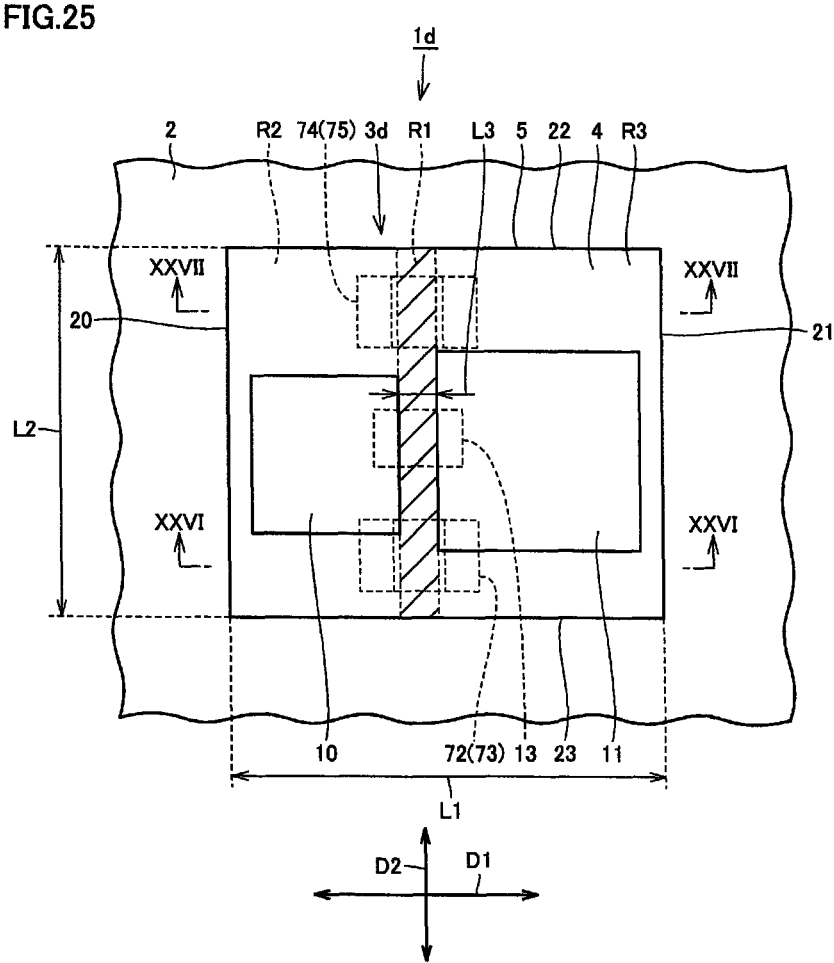
FIG. 25 is a plan view showing an electronic device 1d and a component-embedded substrate 3d according to a fifth embodiment.

FIG. 25 is a plan view showing electronic device 1d and component-embedded substrate 3d according to the fifth embodiment. As shown in FIG. 25, component-embedded substrate 3d includes a resin substrate 5 and chip-type electronic components 13, 72, 73, 74, 75 disposed in resin substrate 5.

Chip-type electronic component 72 and chip-type electronic component 73 are located relatively closer to side surface 23 as compared with implemented components 10, 11, and arranged to extend from region R2 across region R1 to region R3.

Chip-type electronic component 74 and chip-type electronic component 75 are located relatively closer to side surface 22 as compared with implemented components 10, 11, and arranged to extend from region R2 across region R1 to region R3.

Figure 26:
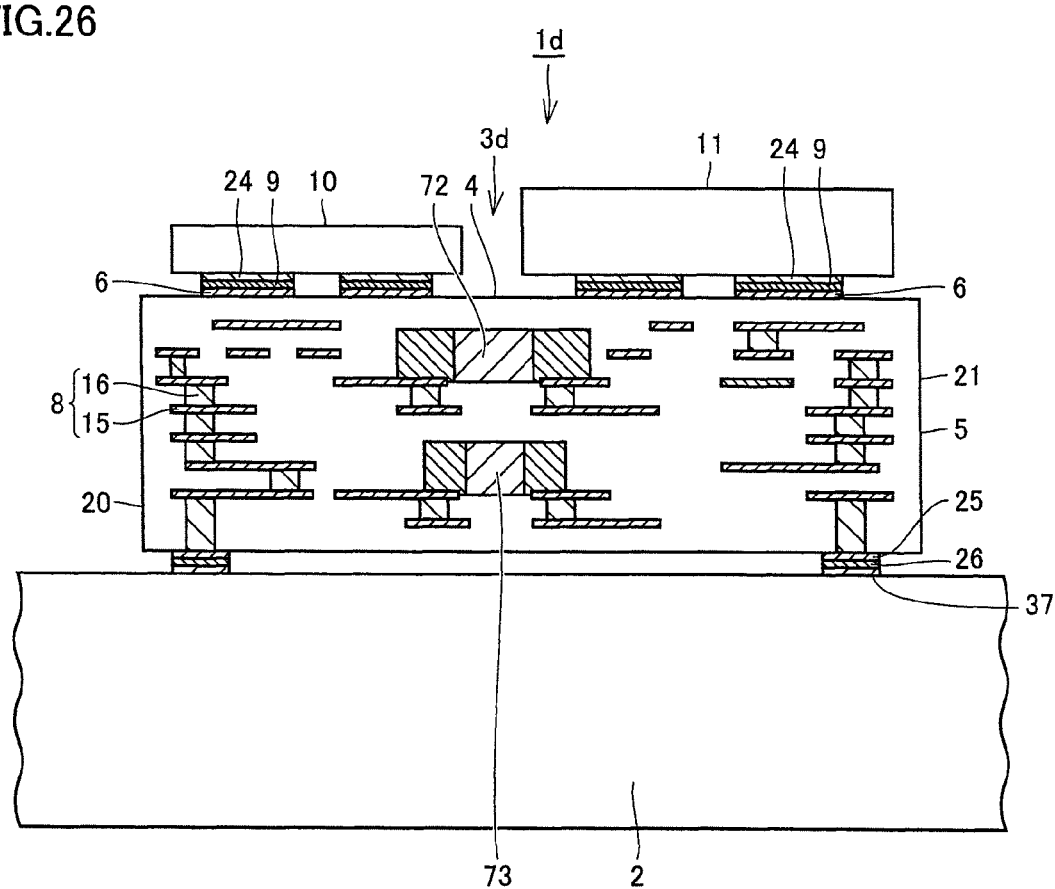
FIG. 26 is a cross-sectional view along a line XXVI-XXVI shown in FIG. 25.

FIG. 26 is a cross-sectional view along a line XXVI-XXVI shown in FIG. 25. As shown in FIG. 26, chip-type electronic component 72 is larger in size than chip-type electronic component 73, and chip-type electronic component 72 is located relatively closer to mount surface 4 as compared with chip-type electronic component 73.

Figure 27:
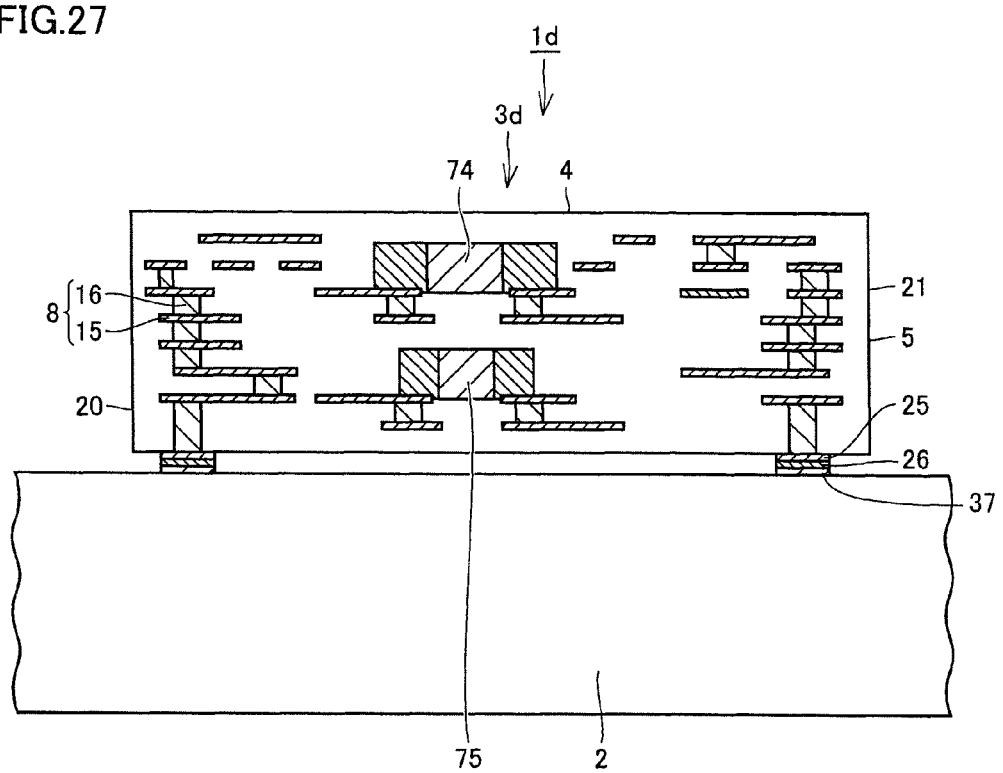
FIG. 27 is a cross-sectional view along a line XXVII-XXVII shown in FIG. 25.

FIG. 27 is a cross-sectional view along a line XXVII-XXVII shown in FIG. 25. As shown in FIG. 27, the size of chip-type electronic component 74 is larger than that of chip-type electronic component 75, and chip-type electronic component 74 is located relatively closer to mount surface 4 as compared with chip-type electronic component 75.

It should be noted here that when an impact force is applied to component-embedded substrate 3d, a greater flexure stress is generated on the mount surface 4 side of resin substrate 5, as compared with a flexure stress generated on the lower surface of resin substrate 5.

Meanwhile, regarding electronic device 1d and component-embedded substrate 3d of the fifth embodiment, chip-type electronic components 72, 74 of a relatively larger size are located relatively closer to mount surface 4, and thus chip-type electronic components 72, 74 reinforce a portion of resin substrate 5 that is in the vicinity of mount surface 4.

Thus, regarding component-embedded substrate 3d of the fifth embodiment as well, damage to component-embedded substrate 3d can be suppressed even when an impact force is externally applied.

Sixth Embodiment

Figure 28:
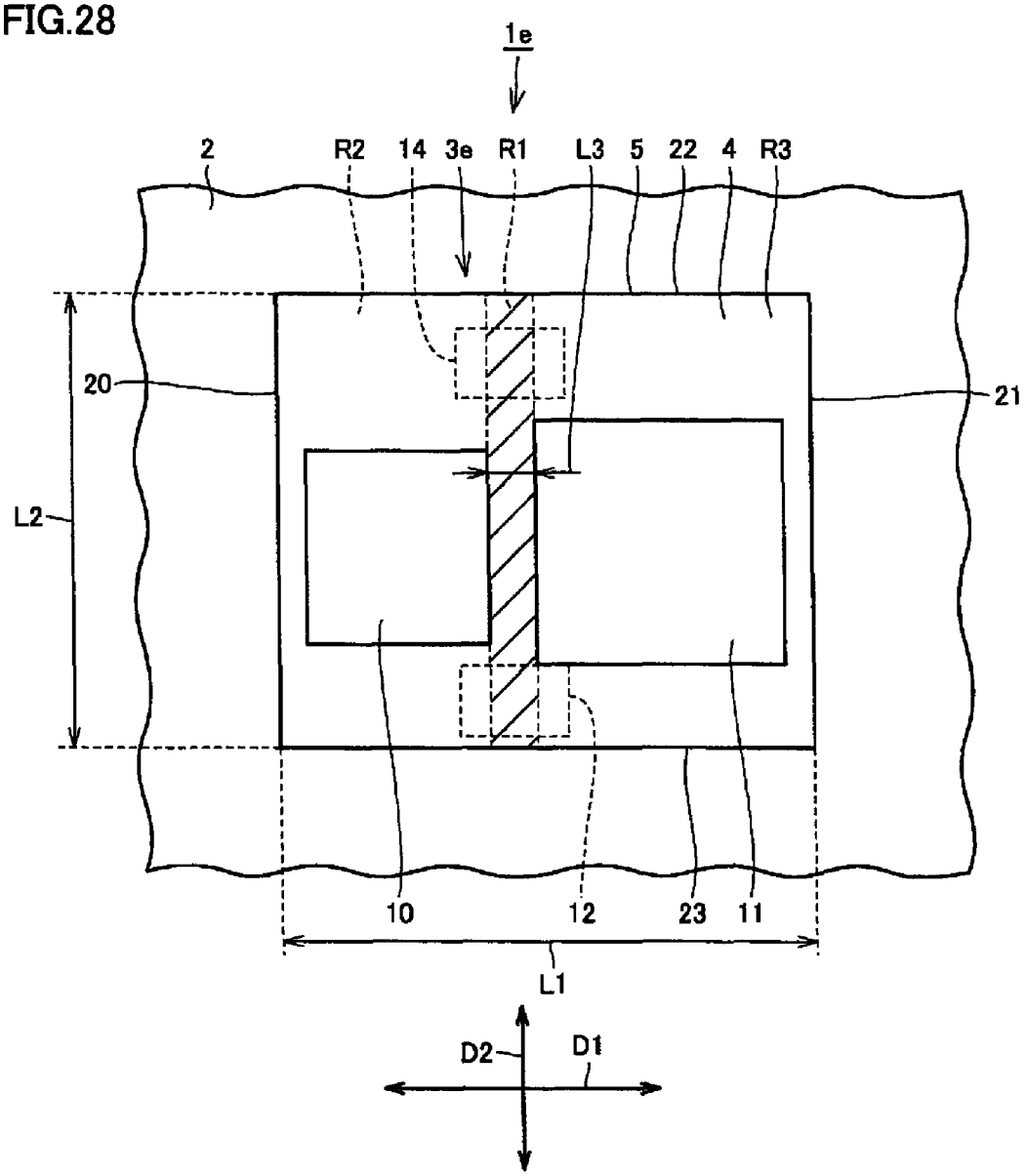
FIG. 28 is a plan view showing an electronic device 1e according to a sixth embodiment.

FIG. 28 is a plan view showing an electronic device 1e according to a sixth embodiment. Of the constituent components shown in FIG. 28, any component identical or corresponding to the component shown in any of FIGS. 1 to 27 is denoted by the same reference character, and the description thereof may not be repeated.

As shown in FIG. 28, electronic device 1e includes a chip-type electronic component 12 and a chip-type electronic component 14 disposed in a resin substrate 5.

Chip-type electronic component 12 is located relatively closer to side surface 23 as compared with implemented components 10, 11, and arranged to extend from region R2 across region R1 to region R3. Chip-type electronic component 14 is located relatively closer to side surface 22 as compared with implemented components 10, 11, and arranged to extend from region R2 across region R1 to region R3.

Chip-type electronic component 12 reinforces the end of region R1 that is located on the side surface 23 side, and chip-type electronic component 14 reinforces the end of region R1 that is located on the side surface 22 side.

As shown in FIG. 28, it is not a requisite feature of the present invention to dispose a chip-type electronic component (such as chip-type electronic component 13 in FIG. 1) between implemented component 10 and implemented component 11.

EXAMPLES

Using Tables 1 and 2 below and FIGS. 1 and 28, for example, a description will be given of Examples of the present invention. Table 1 below shows the result of a drop test for electronic devices of Comparable Example 1. The electronic devices of Comparative Example 1 are each an electronic device which corresponds to electronic device 1 in FIG. 1 in that two implemented components are implemented on the mount surface, however, the chip-type electronic components are not disposed in the resin substrate in Comparative Example 1.

In the drop test illustrated in Table 1, 36 electronic devices of Comparative Example 1 were freely dropped ten times from a height of 1.0 m measured from a concrete floor. The number of resin substrates that had consequently been damaged is shown.

Table 2 below illustrates a drop test for electronic devices of Comparative Example 2 and electronic devices 1e shown in FIG. 28. The electronic devices of Comparative Example 2 are each an electronic device which corresponds to the example shown in FIG. 1 in that chip-type electronic component 13 is disposed in resin substrate 5, however, chip-type electronic component 12 and chip-type electronic component 14 are not disposed in the electronic device of Comparative Example 2.

In this drop test, 36 electronic devices of Comparative Example 2 and electronic devices shown in FIG. 28 were freely dropped ten times from a height of 1.2 m to a concrete floor, and the number of resin substrates to which cracks had consequently occurred is shown.

TABLE 1

Height for drop test: 1.0 m

| condition | number of defective samples/ total number of samples |
|---|---|
| electronic device without chip-type electronic components (Comparative Example 1) | 3/36 |

TABLE 2

Height for drop test: 1.2 m

| condition | number of defective samples/ total number of samples |
|---|---|
| electronic device shown in FIG. 1 equipped with only chip-type electronic component 13 (Comparative Example 2) | 2/36 |
| electronic device shown in FIG. 28 | 0/36 |

It is seen that in the drop test illustrated in Table 1, three electronic devices out of the 36 electronic devices of Comparative Example 1 were damaged. It is seen that in the drop test illustrated in Table 2, cracks occurred to two electronic devices out of the 36 electronic devices of Comparative Example 2. It is further seen that to all of the 36 electronic devices 1e shown in FIG. 28, no crack occurred.

It is accordingly seen that cracks are less likely to occur to resin substrate 5 of electronic device 1e shown in FIG. 28, as compared with the electronic devices of Comparative Examples 1 and 2.

The foregoing is the description of the embodiments of the present invention. It should be construed that the embodiments disclosed herein are by way of illustration in all respects, not by way of limitation. It is intended that the scope of the present invention is defined by claims, and encompasses all modifications equivalent in meaning and scope to the claims. Further, the above-described numerical values and the like are given by way of example, and the present invention is not limited to the above-described numerical values and ranges.

As illustrated in connection with each embodiment, the embedded chip-type electronic component can be arranged in the vicinity of the outer periphery of mount surface 4 that is a region where no implemented component is arranged, to thereby more effectively achieve the effect of suppressing occurrence of cracks. The present invention, however, is not limited to this. Namely, as long as the embedded chip-type electronic component is arranged in the vicinity of the outer periphery of mount surface 4, the effect of the present invention can be achieved.

The number of components mounted on mount surface 4 is not limited to two, and may be three or more. In this case, it is preferable to adapt two relatively larger mounted components, out of the three or more mounted components, to serve as a first mounted component and a second mounted component of the present invention, and arrange a first chip-type electronic component and a second chip-type electronic component of the present invention, since this is most effective for suppressing occurrence of cracks.

As long as an embedded chip-type electronic component is arranged in the vicinity of the outer periphery of mount surface 4, it is not necessary to arrange a plurality of embedded chip-type electronic components, namely it may be one chip-type electronic component that is disposed in the vicinity of the outer periphery thereof.

INDUSTRIAL APPLICABILITY

The present invention is applicable to a component-embedded substrate.

REFERENCE SIGNS LIST 1, 1a-1e: electronic device; 2: circuit board; 3, 3a-3e: component-embedded substrate; 4: mount surface; 5: resin substrate; 6: surface conductor; 8: internal conductor; 9: joint; 10, 11: implemented component; 12, 13, 14, 62, 64, 70, 71, 72, 73, 74, 75: chip-type electronic component; 15: internal interconnect; 16: via; 17, 27: dielectric body; 18, 19, 25, 28, 29: electrode; 20, 21, 22, 23: side surface; 30, 35, 38, 40, 44, 47, 49, 51, 53: resin layer; 31, 36, 39, 41, 45, 48, 50, 52, 54: resin sheet; 32: via hole; 33: paste; 34: hole; 42, 46: hole portion; 55: mold; 56: platform; 57: columnar part; 60: intermediate substrate; 61: cavity

The invention claimed is:

1. A component-embedded substrate comprising:
a resin substrate having a mount surface and a peripheral surface surrounding a perimeter of said mount surface;
a first mounted component mounted on said mount surface;
a second mounted component mounted on said mount surface and spaced from said first mounted component;
at least one first embedded electronic component chip disposed in said resin substrate; and
at least one second embedded electronic component chip disposed in said resin substrate and arranged to extend in a first region of the mount surface and a second region of the mount surface as viewed in a direction perpendicular to said mount surface,
said first embedded electronic component chip being located close to the peripheral surface of said resin substrate,
said mount surface including:
said first region located between said first mounted component and said second mounted component and extending in a cross direction crossing an arrangement direction in which said first mounted component and said second mounted component are arranged with respect to each other; and
said second region located outside said first region,
said first embedded electronic component chip being arranged to extend in said first region and said second region as viewed in a direction perpendicular to said mount surface,
wherein said first embedded electronic component chip is located relatively closer to the peripheral surface of said resin substrate as compared with said first mounted component and said second mounted component,
wherein at least one of the first mounted component and the second mounted component comprises a chip component, and
wherein said second embedded electronic component chip overlaps a part of said first mounted component and a part of said second mounted component when viewed in the direction perpendicular to said mount surface, said second embedded electronic component chip extending below said first mounted component and said second mounted component.

2. The component-embedded substrate according to claim 1, wherein said first embedded electronic component chip is larger in size than said second embedded electronic component chip.

3. A component-embedded substrate comprising:
a resin substrate having a mount surface and a peripheral surface surrounding a perimeter of said mount surface;
a first mounted component mounted on said mount surface;
a second mounted component mounted on said mount surface and spaced from said first mounted component; and
at least one first embedded electronic component chip disposed in said resin substrate,
said first embedded electronic component chip being located close to the peripheral surface of said resin substrate,
said mount surface including:
a first region located between said first mounted component and said second mounted component and extending in a cross direction crossing an arrangement direction in which said first mounted component and said second mounted component are arranged with respect to each other; and
a second region located outside said first region,
said first embedded electronic component chip being arranged to extend in said first region and said second region as viewed in a direction perpendicular to said mount surface,
wherein said first embedded electronic component chip is located relatively closer to the peripheral surface of said resin substrate as compared with said first mounted component and said second mounted component,
wherein at least one of the first mounted component and the second mounted component comprises a chip component,
wherein said peripheral surface includes a first side surface and a second side surface opposite to said first side surface, said first and second side surfaces being located with respect to each other along said cross direction, and
wherein said first embedded electronic component chip includes a first electronic component located relatively closer to said first side surface as compared with said second mounted component, and a second electronic component chip located relatively closer to said second side surface as compared with said first mounted component.

4. A component-embedded substrate comprising:
a resin substrate having a mount surface and a peripheral surface surrounding a perimeter of said mount surface;
a first mounted component mounted on said mount surface;
a second mounted component mounted on said mount surface and spaced from said first mounted component; and
at least one first embedded electronic component chip disposed in said resin substrate,
said first embedded electronic component chip being located close to the peripheral surface of said resin substrate,
said mount surface including:
   a first region located between said first mounted component and said second mounted component and extending in a cross direction crossing an arrangement direction in which said first mounted component and said second mounted component are arranged with respect to each other; and
   a second region located outside said first region,
said first embedded electronic component chip being arranged to extend in said first region and said second region as viewed in a direction perpendicular to said mount surface,
wherein said first embedded electronic component chip is located relatively closer to the peripheral surface of said resin substrate as compared with said first mounted component and said second mounted component,
wherein at least one of the first mounted component and the second mounted component comprises a chip component,
wherein said resin substrate has a lower surface located opposite to said mount surface, and
wherein said first embedded electronic component chip is located relatively closer to said mount surface than to said lower surface.

5. The component-embedded substrate according to claim 1, wherein said first embedded electronic component chip includes a third electronic component chip and a fourth electronic component chip located relatively closer to said mount surface as compared with said third electronic component chip.

6. The component-embedded substrate according to claim 5, wherein said fourth electronic component chip is larger in size than said third electronic component chip.

7. The component-embedded substrate according to claim 1, wherein said first embedded electronic component chip is larger in size than said second embedded electronic component chip.

8. The component-embedded substrate according to claim 1, wherein said first embedded electronic component chip is located relatively closer to the peripheral surface of said resin substrate as compared with said first mounted component and said second mounted component.

9. The component-embedded substrate according to claim 1, wherein said first embedded electronic component chip is located relatively closer to the peripheral surface of said resin substrate as compared with said first mounted component and said second mounted component.

10. The component-embedded substrate according to claim 2, wherein said first embedded electronic component chip is located relatively closer to the peripheral surface of said resin substrate as compared with said first mounted component and said second mounted component.

11. The component-embedded substrate according to claim 1, wherein
said peripheral surface includes a first side surface and a second side surface opposite to said first side surface, said first and second side surfaces being located with respect to each other along said cross direction, and
said first embedded electronic component chip includes a first electronic component located relatively closer to said first side surface as compared with said second mounted component, and a second electronic component chip located relatively closer to said second side surface as compared with said first mounted component.

12. The component-embedded substrate according to claim 1, wherein
said peripheral surface includes a first side surface and a second side surface opposite to said first side surface, said first and second side surfaces being located with respect to each other along said cross direction, and
said first embedded electronic component chip includes a first electronic component located relatively closer to said first side surface as compared with said second mounted component, and a second electronic component chip located relatively closer to said second side surface as compared with said first mounted component.

13. The component-embedded substrate according to claim 2, wherein
said peripheral surface includes a first side surface and a second side surface opposite to said first side surface, said first and second side surfaces being located with respect to each other along said cross direction, and
said first embedded electronic component chip includes a first electronic component located relatively closer to said first side surface as compared with said second mounted component, and a second electronic component chip located relatively closer to said second side surface as compared with said first mounted component.

14. The component-embedded substrate according to claim 1, wherein
said peripheral surface includes a first side surface and a second side surface opposite to said first side surface, said first and second side surfaces being located with respect to each other along said cross direction, and
said first embedded electronic component chip includes a first electronic component located relatively closer to said first side surface as compared with said second mounted component, and a second electronic component chip located relatively closer to said second side surface as compared with said first mounted component.

* * * * *

UNITED STATES PATENT AND TRADEMARK OFFICE
CERTIFICATE OF CORRECTION

PATENT NO. : 9,854,681 B2
APPLICATION NO. : 14/327806
DATED : December 26, 2017
INVENTOR(S) : Toshiro Adachi Page 1 of 1

It is certified that error appears in the above-identified patent and that said Letters Patent is hereby corrected as shown below:

In the Specification

Column 4, Line 47, "and an electrode" should read -- and an electrode 25 --

Signed and Sealed this
First Day of May, 2018

Andrei Iancu
*Director of the United States Patent and Trademark Office*